US010287687B2

(12) United States Patent
Je et al.

(10) Patent No.: US 10,287,687 B2
(45) Date of Patent: May 14, 2019

(54) SUBSTRATE PROCESSING DEVICE

(71) Applicant: EUGENE TECHNOLOGY CO., LTD., Yongin-si, Gyeonggi-do (KR)

(72) Inventors: Sung-Tae Je, Yongin-si (KR); Jae-Ho Lee, Yongin-si (KR); Sang-Ho Choi, Yongin-si (KR); Seung-Hyun Yoon, Yongin-si (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 340 days.

(21) Appl. No.: 15/038,678

(22) PCT Filed: Dec. 10, 2014

(86) PCT No.: PCT/KR2014/012123
§ 371 (c)(1),
(2) Date: May 23, 2016

(87) PCT Pub. No.: WO2015/105284
PCT Pub. Date: Jul. 16, 2015

(65) Prior Publication Data
US 2016/0289834 A1    Oct. 6, 2016

(30) Foreign Application Priority Data
Jan. 9, 2014  (KR) ........................ 10-2014-0003063

(51) Int. Cl.
*C23C 16/44* (2006.01)
*C23C 16/46* (2006.01)
(Continued)

(52) U.S. Cl.
CPC .......... *C23C 16/46* (2013.01); *C23C 16/4412* (2013.01); *C23C 16/45508* (2013.01);
(Continued)

(58) Field of Classification Search
None
See application file for complete search history.

(56) References Cited

U.S. PATENT DOCUMENTS 6,051,100 A * 4/2000 Walko, II .......... H01J 37/32623
118/723 E
6,261,408 B1 * 7/2001 Schneider ........... C23C 16/4412
118/715
(Continued)

FOREIGN PATENT DOCUMENTS

KR    10-0927375 B1    11/2009
KR    10-2011-0062534 A    6/2011
KR    10-1312592 B1    9/2013

OTHER PUBLICATIONS

JPH07263351 with English Translation (1995).*
JP2004342703 with English Translation (2004).*

*Primary Examiner* — Charles Capozzi
(74) *Attorney, Agent, or Firm* — Rabin & Berdo, P.C.

(57) ABSTRACT

Provided is an apparatus for processing a substrate. The apparatus includes a chamber providing an inner space in which a process with respect to the substrate is performed, a susceptor disposed in the inner space and on which the substrate is placed, a fixing plate disposed in an exhaust port disposed in a sidewall of the chamber along a circumference of the susceptor, the fixing plate having a plurality of through-holes, and at least one sliding plate disposed on an upper or lower portion of the fixing plate to rotate with respect to a center of the susceptor, the at least one sliding plate selectively opening and closing the through-holes.

7 Claims, 9 Drawing Sheets

(51) Int. Cl.
*H01L 21/67* (2006.01)
*H01L 21/687* (2006.01)
*C23C 16/455* (2006.01)
*C23C 16/52* (2006.01)
*C23C 16/54* (2006.01)
*H01L 21/677* (2006.01)

(52) U.S. Cl.
CPC ........ *C23C 16/45565* (2013.01); *C23C 16/52* (2013.01); *C23C 16/54* (2013.01); *H01L 21/6719* (2013.01); *H01L 21/67709* (2013.01); *H01L 21/68785* (2013.01)

(56) References Cited

U.S. PATENT DOCUMENTS

| | | |
|---|---|---|
| 8,771,417 B2 | 7/2014 | Yoon et al. |
| 2003/0172955 A1 | 9/2003 | Kuroda et al. |
| 2007/0119370 A1* | 5/2007 | Ma .................... C23C 16/18 118/723 E |
| 2010/0206231 A1 | 8/2010 | Yoon et al. |
| 2011/0108524 A1* | 5/2011 | Dhindsa ............ H01J 37/32623 216/59 |
| 2013/0102155 A1* | 4/2013 | Gang .................... H05H 1/30 438/710 |

* cited by examiner

SUBSTRATE PROCESSING DEVICE

TECHNICAL FIELD

The present invention disclosed herein relates to an apparatus for processing a substrate, and more particularly, to an apparatus for processing a substrate which is capable of adjusting a flow passage through which a gas supplied into an inner space of a chamber is exhausted by using a fixing plate and a sliding plate disposed on an exhaust port.

BACKGROUND ART

A semiconductor device includes a plurality of layers on a silicon substrate. The layers are deposited on the substrate through a deposition process. The deposition process has several important issues that are important to evaluate the deposited layers and select a deposition method.

First, one example of the important issues is 'quality' of each of the deposited layers. The 'quality' represents composition, contamination levels, defect density, and mechanical and electrical properties. The composition of the deposited layer may be changed according to deposition conditions. This is very important to obtain a specific composition.

Second, another example of the issues is a uniform thickness over the wafer. Specifically, a thickness of a layer deposited on a pattern having a nonplanar shape with a stepped portion is very important. Here, whether the thickness of the deposited film is uniform may be determined through a step coverage which is defined as a ratio of a minimum thickness of the film deposited on the stepped portion divided by a thickness of the film deposited on the pattern.

The other issue with respect to the deposition may be a filling space. This represents a gap filling in which an insulating layer including an oxide layer is filled between metal lines. A gap is provided to physically and electrically isolate the metal lines from each other. Particularly, uniformity is one of the important issue related to the deposition process. The deposition process is performed in a process chamber under a vacuum atmosphere.

A substrate is loaded in the process chamber. A showerhead is disposed above the substrate. A process gas is supplied through the showerhead onto the substrate and deposited on the substrate to form a desired thin film. The deposition process is performed together with an exhaust process. In the exhaust process, process byproducts generated in the deposition process and non-reaction gases are discharged to the outside.

SUMMARY OF THE INVENTION

The present invention provides an apparatus for processing a substrate by a method of side-exhaust.

The present invention provides an apparatus for processing a substrate which secures uniformity of a thin film deposited on a substrate through uniform exhaust.

Further another object of the present invention will become evident with reference to following detailed descriptions and accompanying drawings.

Technical Solution

Embodiments of the present invention provide an apparatus for processing a substrate, the apparatus including: a chamber providing an inner space in which a process with respect to the substrate is performed; a susceptor disposed in the inner space and on which the substrate is placed; a fixing plate disposed in an exhaust port disposed in a sidewall of the chamber along a circumference of the susceptor, the fixing plate having a plurality of through-holes; and at least one sliding plate disposed on an upper or lower portion of the fixing plate to rotate with respect to a center of the susceptor, the at least one sliding plate selectively opening and closing the through-holes.

In some embodiments, the apparatus may further include an exhaust plate disposed along a circumference of the susceptor on a discharge hole defined between the susceptor and the exhaust port, the exhaust plate having a plurality of upper and lower exhaust holes defined in an inner surface thereof.

In other embodiments, an upper end of each of the fixing plate and the sliding plate may be disposed under the upper exhaust holes.

In still other embodiments, the fixing plate may have a ring shape, and the sliding plate may have a plurality of arc shapes that are spaced apart from each other.

In even other embodiments, the sliding plate may further include: an upper plate disposed on the fixing plate and through which a discharge hole passes; and a side plate connected to an outer circumferential surface of the upper plate to move along the sidewall of the chamber, the side plate having a magnetic body.

In yet other embodiments, the apparatus may further include: a housing spaced apart from an outer wall of the chamber to provide a transfer passage blocked against the outside; a blocking plate disposed in the housing to partition the transfer passage into a plurality of transfer sections; a magnet disposed in each of the transfer sections to apply a magnetic force to the side plate, thereby moving together with the side plate; an elastic member disposed between the blocking plate and the magnet to provide an elastic force toward the magnet; and hydraulic lines each of which is disposed in the transfer section to provide a fluid pressure so that the magnet is movable toward the blocking plate.

In further embodiments, the sliding plate may be capable of being switched between an opening position at which the through-hole communicates with the discharge hole to correspond to each other and a blocking position at which the through-hole is closed.

In still further embodiments, the apparatus may further include: a flow rate adjustor disposed in the hydraulic line to adjust a flow rate of the hydraulic line; and a controller connected to the flow adjustor to control the flow rate adjustor.

In even further embodiments, the chamber may include: a main body; and a chamber lid disposed on the chamber body to close an upper portion of the chamber body, wherein the apparatus for processing the substrate may further include a supply port disposed in the chamber lid to supply a gas toward the inner space.

Advantageous Effects

According to the embodiment of the present invention, the exhaust flow of the process gas supplied into the inner space of the chamber may be controlled through the fixing plate and the sliding plate on the exhaust port disposed along the inner wall of the chamber. Also, the flow of the process gas supplied onto the substrate may be controlled to form the uniform thin film, thereby improving productivity and quality of the substrate.

BEST MODE

Figure 1:
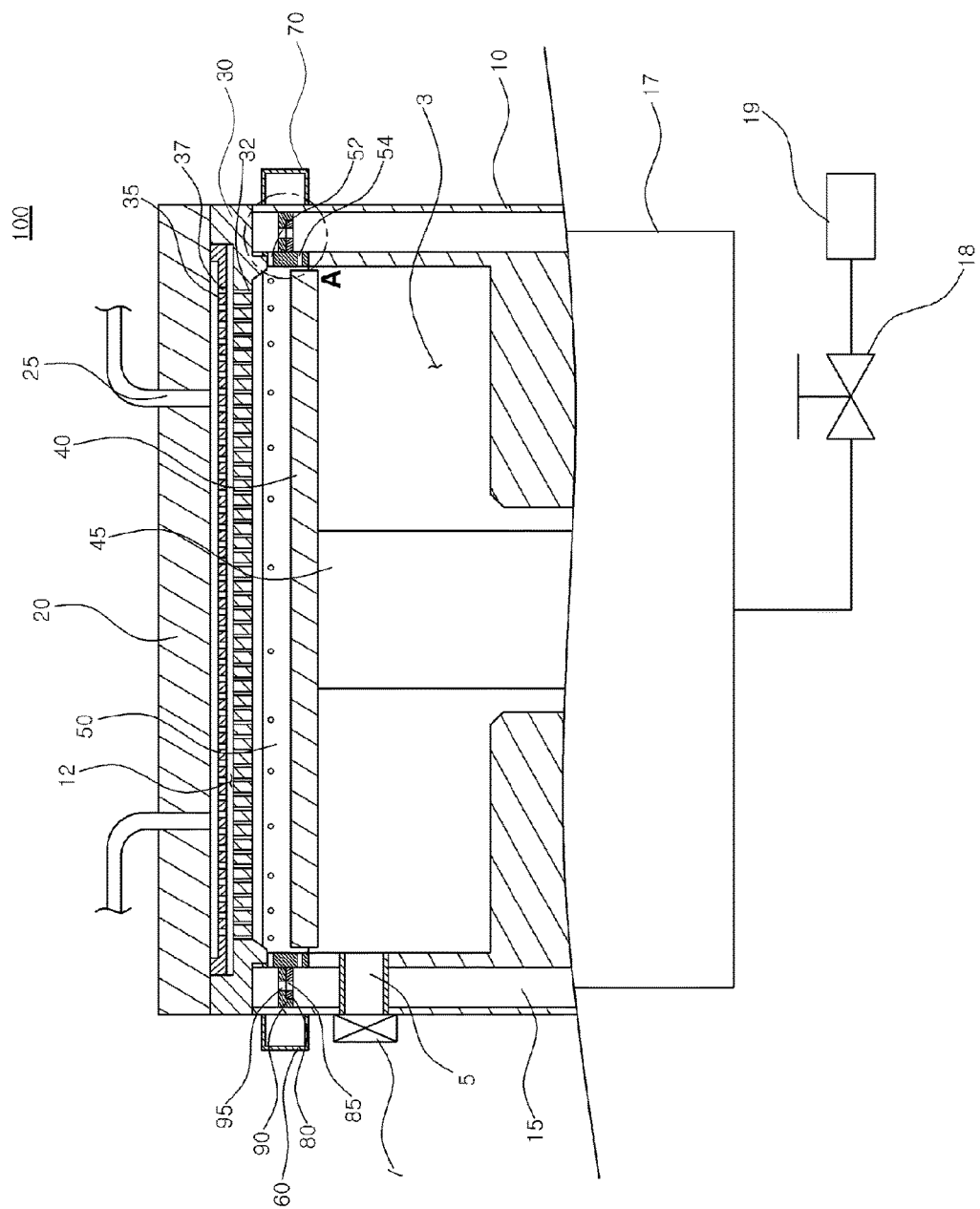
FIGS. 1 and 2 are schematic views of a substrate processing apparatus according to an embodiment.

Hereinafter, exemplary embodiments of the present invention will be described in detail with reference to FIGS. 1 to 9. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the shapes of components are exaggerated for clarity of illustration.

Although a deposition device is exemplified below, the present invention may be applicable to various substrate processing apparatuses including a substrate supporting unit. Also, although a wafer W is exemplified below, the present invention may be applicable to various objects to be processed.

Figure 2:
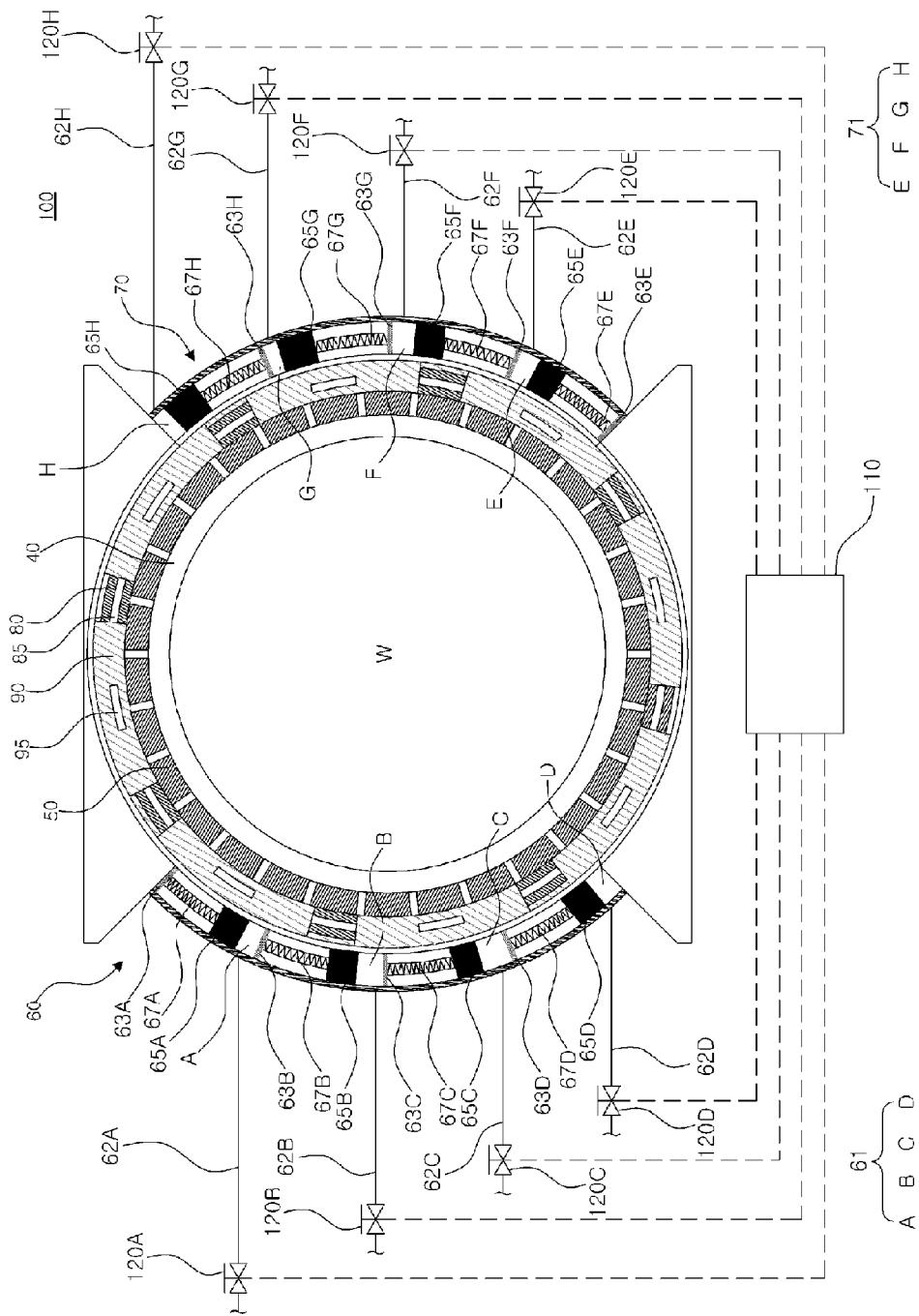
Figure 3:
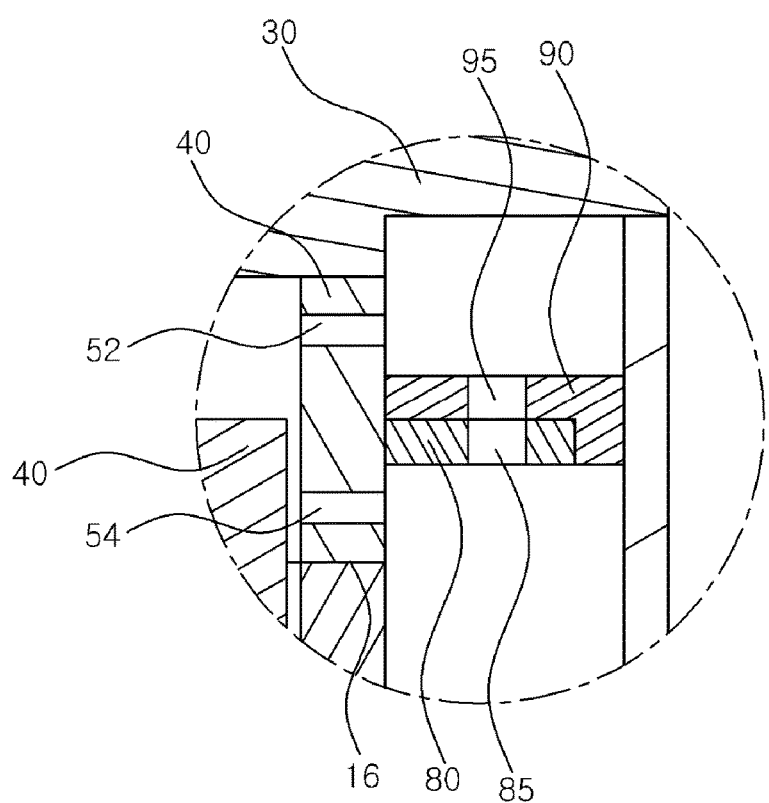
FIG. 3 is an enlarged view of A of FIG. 1.
Figure 4:
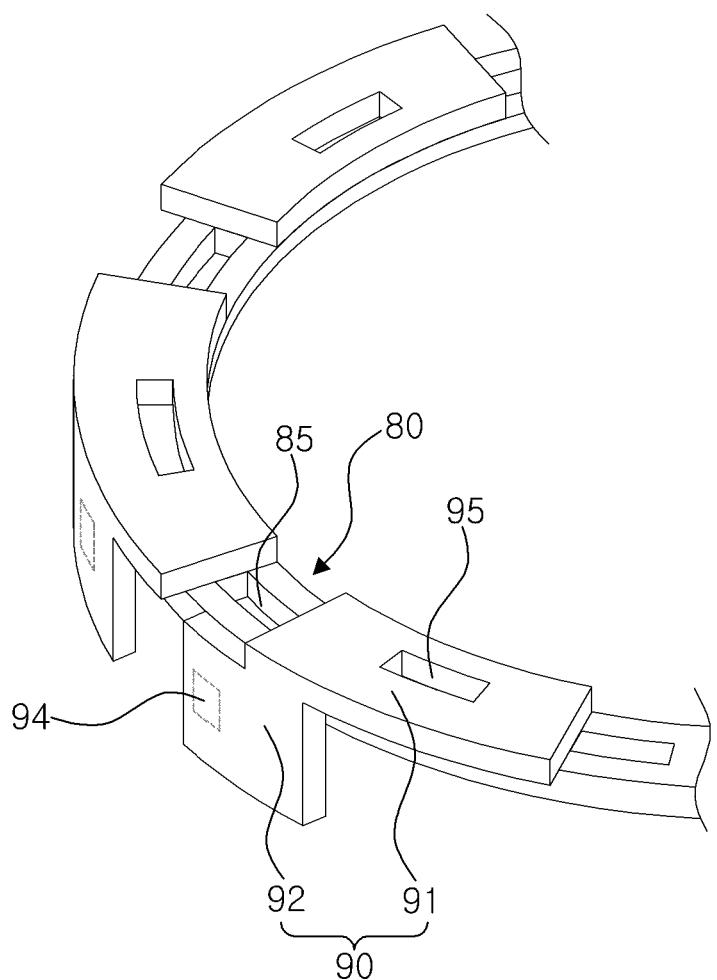
FIG. 4 is an enlarged view of a fixing plate and a sliding plate of FIG. 1.

FIGS. 1 and 2 are schematic views of a substrate processing apparatus according to an embodiment, FIG. 3 is an enlarged view of A of FIG. 1, and FIG. 4 is an enlarged view of a fixing plate and a sliding plate of FIG. 1. As illustrated in FIGS. 1 to 4, a substrate processing apparatus 100 includes a chamber body 10 and a chamber lid 20. The chamber body 10 has an opened upper side. The chamber lid 20 opens or closes the opened upper side of the chamber body 10. When the chamber lid 20 closes the opened upper side of the chamber body 10, the chamber body 10 and the chamber lid 20 define an inner space closed against the outside. Also, as illustrated in FIG. 2, the inner space 3 has a circular section. The chamber body 10 may have a recess part recessed from both side surfaces thereof and having the same center as the inner space 3. The recess part may have a curved surface shape. First and second housings 60 and 70 that will be described later are disposed on the recess part.

A substrate W is loaded in the inner space 3 through a passage 5 defined in one side of the chamber body 10. A susceptor 40 is disposed in the inner space 3. The loaded substrate W is placed on a top surface of the susceptor 40. A support shaft 45 is connected to a lower portion of the susceptor 40. The support shaft 45 may support the susceptor 40 and rotate the susceptor 40 while a process is performed. Also, an elevation unit (not shown) is connected to a lower portion of the support shaft 45. Thus, the support shaft 45 is elevatable.

The showerhead 30 has a substantially flat plate shape and disposed between the chamber body 10 and the chamber lid 20. Thus, the opened upper side of the chamber body 10 is closed by the showerhead 30 and the chamber lid 20. Alternatively, the showerhead 30 may be fixed to a bottom surface of the chamber lid 20 through a separate coupling member. Here, the opened upper side of the chamber body 10 may be closed by the chamber lid 20.

A supply port 25 may be disposed in the chamber lid 20. A process gas is supplied into the inner space 3 through the supply port 25. The showerhead 30 has a concave top surface. The concave top surface is spaced from a bottom surface of the chamber lid 20 to define a buffer space 12. The process gas is filled into the buffer space 12 through the supply port 25 and supplied into the inner space 3 through the showerhead 30.

Also, a buffer plate 35 may be disposed in the buffer space 12 to re-diffuse the process gas, thereby supplying a uniform process gas onto the substrate W. Each of the showerhead and the buffer plate has a plurality of injection holes 32 and 37. The process gas passes through each of the injection holes 32 and 37 and is injected toward the substrate W. The process gas moves onto a surface of the substrate W to decompose on the surface of the substrate W through a heater disposed in the susceptor 40, thereby forming a thin film. The process gas may be selected by the kind of the thin film.

An exhaust port 15 is disposed along a sidewall of the chamber body 10. The exhaust plate 50 is disposed on a circumference of the susceptor 40 and on a discharge hole 16 defined between the susceptor 40 and the exhaust port 15. Also, upper and lower exhaust holes 52 and 54 may be defined in the exhaust plate 50. Reaction byproducts generated in a process with respect to the substrate W and non-reaction gases may pass through the upper and lower exhausts holes 52 and 54 of the exhaust plate 50 and be exhausted to the exhaust port 15. An exhaust line 17 may be connected to the exhaust port 15. An exhaust valve 18 may be disposed in the exhaust line 17 to open and close the exhaust line 17. Also, an exhaust pump 18 may be disposed on the exhaust line 17 to forcibly discharge the reaction byproducts and the non-reaction gases to the outside through the exhaust line 17.

The fixing plate 80 has a ring shape and is disposed along the exhaust port 15. The fixing plate 80 has a plurality of through-holes 85. The through-holes 85 are spaced a predetermined distance apart from each other. The sliding plate 90 is disposed to contact an upper portion (or a lower portion) of the fixing plate 80. A discharge hole 95 having a size corresponding to that of the through-hole 85 of the fixing plate is defined in the sliding plate 90. The sliding plate 90 may be provided in plurality. The plurality of sliding plates 90 may be spaced apart from each other. The sliding plate 90 may have a circular arc shape having the same curvature radius as the fixing plate 80.

The sliding plate 90 may include an upper plate 91 in which the discharge hole 95 is defined and a side plate 92 that is substantially vertically connected to an outer circumferential surface of the upper plate 91. The side plate 92 is disposed in the recess part of the chamber body 10 to contact an inner wall of the chamber body 10 to move. A magnetic body 94 may be disposed on an inner surface of the side plate 92. The first and second housings 60 and 70 may be disposed at both sides of a recessed outer wall of the chamber body 10. The first and second housings 60 and 70 may be parallelly disposed along an outer side of the side plate 91 disposed in the chamber body 10.

The first and second housings 60 and 70 are disposed along the outer wall of the chamber body 10 to provide first and second transfer passages 61 and 71 blocked against the outside. A plurality of blocking plates 63A, 63B, 63C, . . . , and 63H) are disposed in the first and second transfer passages 61 and 71 to partition the first and second transfer passages 61 and 71 into a plurality of transfer sections A, B, C, . . . , and H. The transfer sections A, B, C, . . . , and H may be blocked against the outside to prevent particles generated in the transfer sections A, B, C, . . . , and H from being leaked to the outside.

Magnets 65A, 65B, 65C, . . . , and 65H may be disposed in the transfer sections A, B, C, . . . , and H, respectively. Each of the magnets 65A, 65B, 65C, . . . , and 65H may apply a magnetic force to the magnetic body 94 disposed on the side plate 91 to move the sliding plate 90 corresponding to each of the magnets 65A, 65B, 65C, . . . , and 65H. Also, elastic members 67A, 67B, 67C, . . . , and 67H are respectively disposed between the magnets 65A, 65B, 65C, . . . , and 65H and the blocking plates 63A, 63B, 63C, . . . , and 63H. Each of the elastic members 63A, 63B, 63C, . . . , and 63H may provide an elastic force toward each of the magnets 65A, 65B, 65C, . . . , and 65H. Hydraulic lines 62A, 62B, 62C, . . . , and 62H each of which provides a fluid pressure (or a pneumatic pressure) may be connected to each of the transfer sections A, B, C, . . . , and H so that each of the magnets 65A, 65B, 65C, . . . , and 65H move toward each of the blocking plates 63A, 63B, 63C, . . . , and 63H.

Also, a flow rate adjuster 120 (for example, a valve or a mass flow controller (MFC)) for adjusting a flow rate of each of the hydraulic lines 62A, 62B, 62C, . . . , and 62H may be disposed in each of the hydraulic lines 62A, 62B, 62C, . . . , and 62H. A controller 110 is connected to each of flow rate adjusters 120A, 120B, 120C, . . . , and 120H. The controller 110 may control predetermined flow rate adjusters 120A, 120B, 120C, . . . , and 120H to move each of the magnets 65A, 65B, 65C, . . . , and 65H and rotate the sliding plate 90, thereby exhausting the reaction byproducts and the non-reaction gases to the outside through the exhaust port 15.

Figure 5:
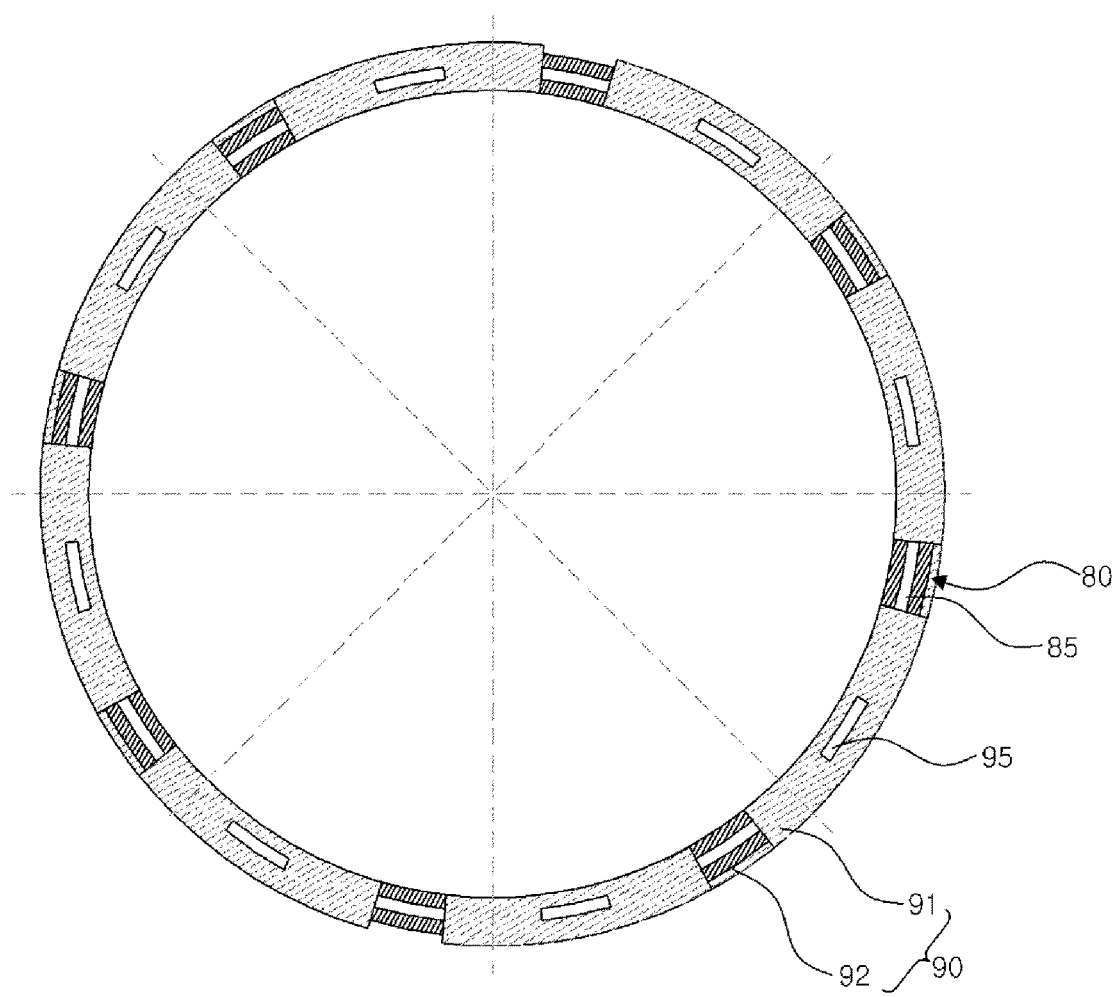
FIGS. 5 and 6 are views illustrating a standby position of the sliding plate of FIG. 2.
Figure 6:
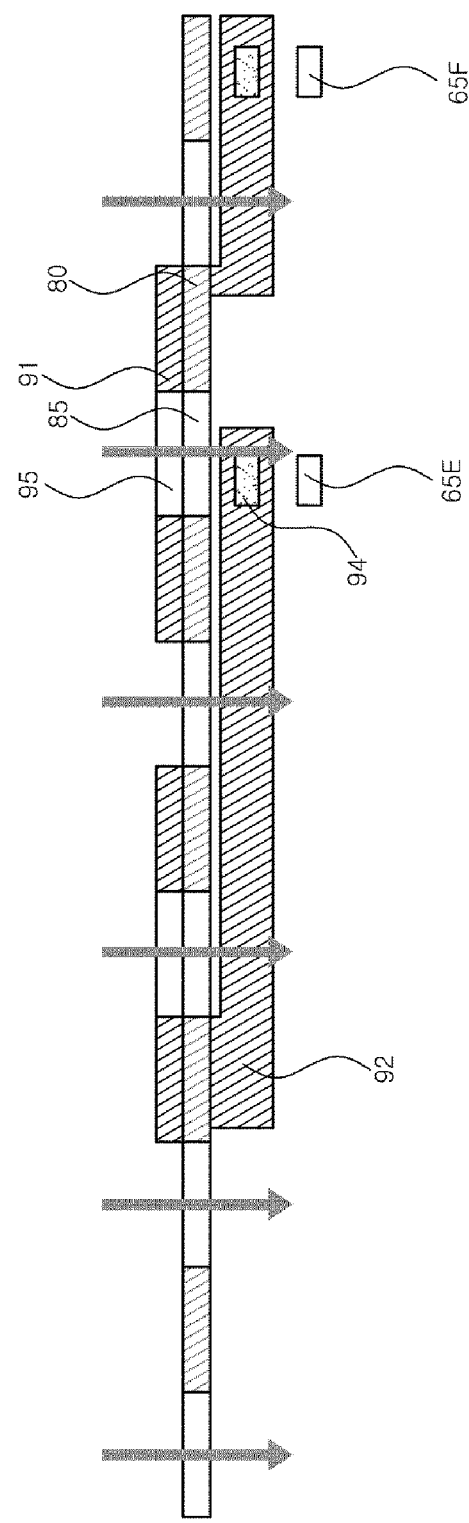
Figure 7:
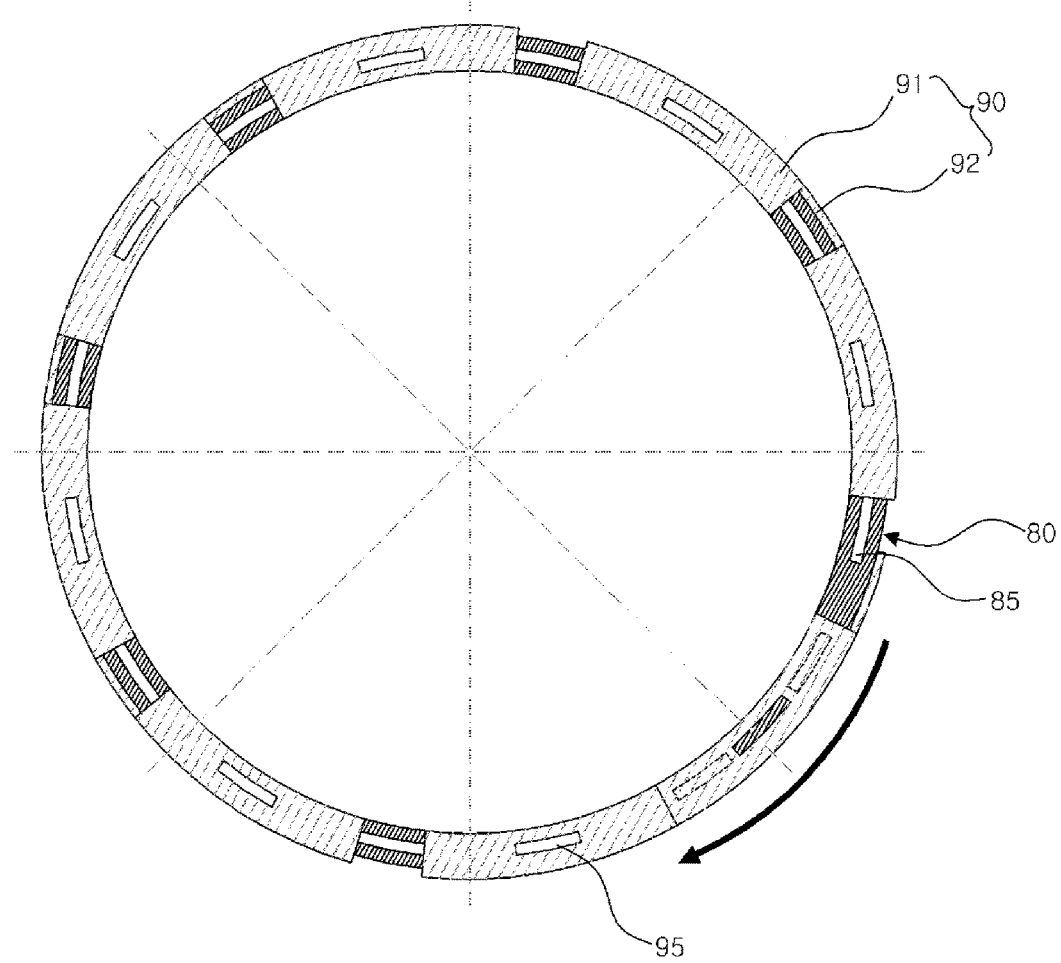
FIGS. 7 and 8 are views illustrating an operation position of the sliding plate of FIG. 2.
Figure 8:
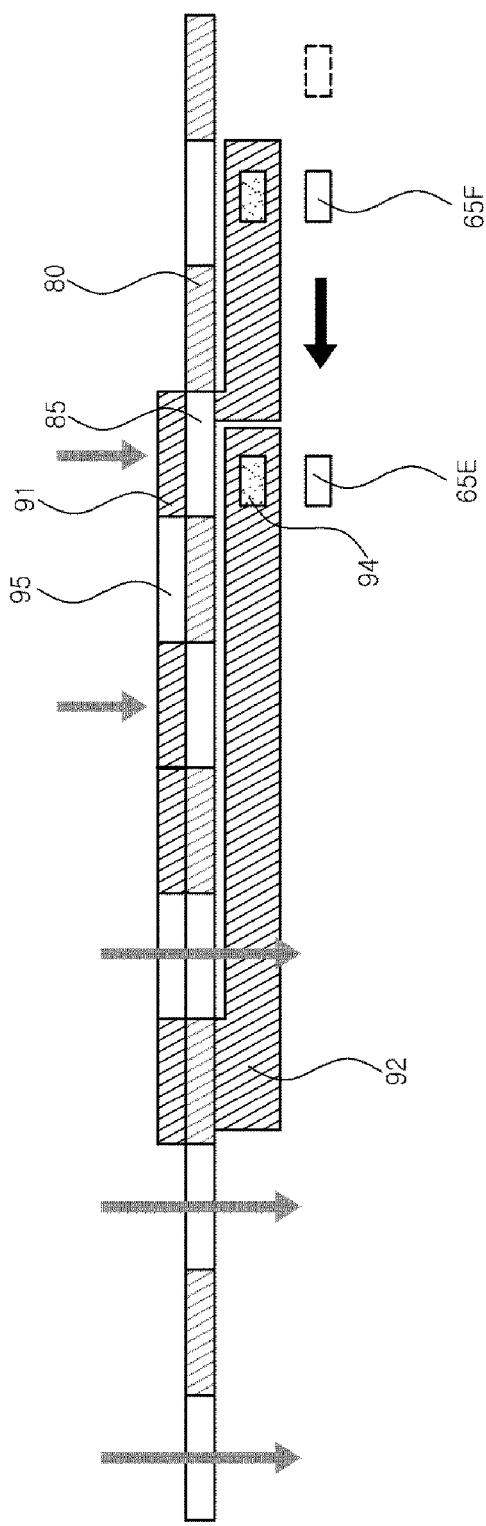

FIGS. 5 to 8 are views illustrating an operation process of the sliding plate of FIG. 2. FIGS. 5 and 6 are views illustrating a standby position of the sliding plate of FIG. 2, and FIGS. 7 and 8 are views illustrating an operation position of the sliding plate of FIG. 2. As described above, the sliding plate 90 may be disposed on the fixing plate 80 to rotate with respect to the center of the susceptor 40. The plurality of through-holes 85 are defined in the fixing plate 80. The through-holes 85 are defined to be spaced a predetermined distance apart from each other. For example, each of the through-holes 85 may be defined at an angle of about 11.25° with respect to the center of the fixing plate 80.

As illustrated in FIGS. 5 and 6, the sliding plate 90 may have the arc shape. Each of the sliding plates 90 may have a center angle of about 33.75° with respect to the center of the fixing plate 80. The discharge hole 95 may be defined in a central portion of the sliding plate 90. The through-hole 85 may communicate with the discharge hole 95 at a standby position of the sliding plate 90 to exhaust the reaction byproducts and the non-reaction gases to the exhaust port 15.

The first and second housings 60 and 70 are disposed at both recessed sides of the chamber body 10. Each of the first and second housings 60 and 70 has each of the first and second transfer passages 61 and 71 connected along the recess part of the chamber body 10 and closed against the outside. The first and second housings 60 and 70 have shapes symmetric to each other with respect to the center of the chamber body 10. The blocking plates 63A, 63B, 63C, . . . , and 63H for partitioning the first and second transfer passages 61 and 71 into the plurality of transfer sections A, B, C, . . . , and H are disposed in the first and second housings 60 and 70.

The first to fourth blocking plates 63A, 63B, 63C, and 63D may be disposed in the first housing 60 in a counterclockwise direction. The transfer section of the first housing 60 may be partitioned into the first to fourth transfer passages A, B, C, and D by the first to fourth blocking plates 63A, 63B, 63C, and 64D. The first magnet 65A may be disposed on the first transfer passage A. The first magnet 65A may move by an attraction force with the magnetic body 94 disposed on the lower portion of the sliding plate 90, and accordingly, the sliding plate 90 corresponding to the first magnet 65A may move together with the first magnet 65A.

The magnet 65 is disposed on each of the transfer passage A to H. Each of the magnets 65A, 65B, 65C, . . . , and 65H is disposed to correspond to the magnetic body 94 disposed on the sliding plate 90. Elastic members 67A, 67B, 67C, . . . , and 67H are respectively disposed between the blocking plates 63A, 63B, 63C, . . . , and 63H and the magnets 65A, 65B, 65C, . . . , and 65H. The elastic member 67 may provide an elastic force toward the magnet 65.

The hydraulic line (or the pneumatic line) is connected to each of the transfer passages A to H. The fluid pressure may be provided to the magnet 65 through the hydraulic line to move the magnet 65. The flow rate adjuster 120 for adjusting the flow rate (or fluid pressure) may be disposed in each of the hydraulic lines (or the pneumatic lines). Here, the controller 110 may be connected to the flow rate adjuster 120 to adjust the flow rate adjustor 120, thereby controlling a movement of the magnet 65.

As illustrated in FIGS. 7 and 8, when the magnet 65 moves, the sliding plate 90 corresponding to the magnet 65 may move together with the magnet 65 to open and close the through-hole 85 of the fixing plate 80. That is, the pneumatic pressure may be applied to at least one of the transfer passages A, B, C, . . . , and H that are predetermined through the controller 110 to move the magnet 65. Thus, the sliding plate 90 corresponding to the magnet 65 may move together with the magnet 65. Therefore, the sliding plate 90 may be switched between the standby position and the process position to control an exhaust flow of the non-reaction gases and the reaction byproducts.

In detail, the process gas injected through the showerhead 30 is supplied to the upper portion of the substrate W. The process gas reacts with the surface of the substrate W to form the thin film in a state where the substrate W is heated by the susceptor 40. Here, the thin film may have a thickness that is proportional to a supply amount of process gas. That is, a thin film having a relatively thin thickness is formed on a portion of the surface of the substrate W to which a small amount of process gas is supplied. Also, a thin film having a relatively thick thickness is formed on a portion of the surface of the substrate W to which a large amount of process gas is supplied. Therefore, when the process gas is uniformly supplied onto an entire surface of the substrate W, the thin film may have a uniform thickness.

However, the thickness of the thin film is proportional to a heating temperature of the susceptor 40 in addition to the supply amount of process gas. Thus, the thin film formed on a portion of the surface of the substrate W having a low heating temperature has a thin thickness, and the thin film formed on a portion of the surface of the substrate W having a high heating temperature has a thick thickness. Thus, when the heating temperature of the susceptor 40 is uniform, the thin film may have a uniform thickness. Therefore, the susceptor 40 having an entirely uniform heating temperature is ideal.

However, practically, it is impossible to manufacture the susceptor 40 having a perfectly uniform heating temperature. In particular, recently, the substrate W increases in size to increase a size of the susceptor 40. Thus, it is difficult to form a uniform temperature dispersion on the substrate W. That is, while the substrate is heated at a process temperature, the heater may be broken down or deteriorated in performance, and also the heater may emit locally non-uniform radiant heat.

In addition, there are various factors affecting the thickness of the thin film. It is necessary to artificially adjust a portion of the above-described factors so as to form a thin film having a uniform thickness. Thus, in the current embodiment of the present invention, the supply amount of process gas is artificially non-uniformly adjusted according to portions of the substrate W to form a thin film having a uniform thickness on an entire surface of the substrate W. Also, since the supply amount of process gas is proportional to a flow rate of the gas exhausted through the exhaust port 15, an amount of exhausted gas may be artificially non-uniformly adjusted according to portions of the substrate W.

For example, a thin film is formed by using a dummy substrate W. Then, the thickness of the thin film is measured. Here, as illustrated in FIG. 6, the whole through-holes 85 communicate with the exhaust holes 95 to uniformly supply the process gas onto the entire area of the surface of the substrate W. Here, the exhaust holes 95 may be alternately defined to selectively close the through-holes 85. Thus, the supply amount of process gas supplied onto each are of the surface of the substrate W may be adjusted.

That is, when the thin film has a thickness greater than a reference value on a certain area of the surface of the substrate W, the through-hole 85 defined adjacent to the outside of the corresponding area may be closed to reduce an amount of process gas. When the process for adjusting the amount of process gas is performed a couple of times, the thin film having a uniform thickness may be formed. Thus, later processes may be performed by using the substrate W on which the thin film having a uniform thickness is formed.

Although the present invention is described in detail with reference to the exemplary embodiments, the invention may be embodied in many different forms. Thus, technical idea and scope of claims set forth below are not limited to the preferred embodiments.

Mode for Invention

Figure 9:
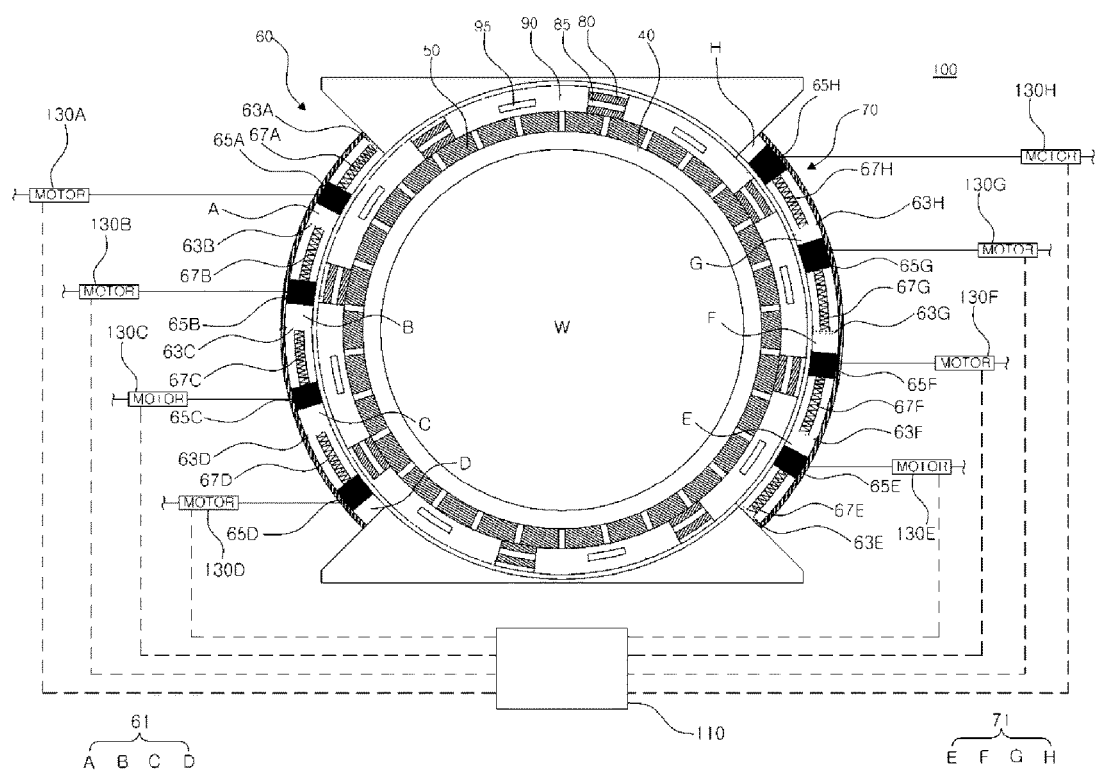
FIG. 9 is a modified example of the substrate processing apparatus of FIG. 2.

FIG. 9 is a modified example of the substrate processing apparatus of FIG. 2. As illustrated in FIG. 9, the hydraulic method may be substituted with a driving method by using driving motors 130A, 130B, 130C, . . . , and 130H. That is, each of the magnets 65A, 65B, 65C, . . . , and 65H may move by each of the driving motors 130A, 130B, 130C, . . . , and 130H corresponding thereto. A power of each of the driving motors 130A, 130B, 130C, . . . , and 130H may be transmitted to each of the magnets 65A, 65B, 65C, . . . , and 65H through a gear. Also, the driving motors 130A, 130B, 130C, . . . , and 130H may be individually controlled by the controller 110.

INDUSTRIAL APPLICABILITY

The present invention may be applicable to a various apparatus for manufacturing semiconductor or a various method for manufacturing semiconductor.

What is claimed is:

1. An apparatus for processing a substrate, the apparatus comprising:
    a chamber providing an inner space in which a process with respect to the substrate is performed;
    a susceptor disposed in the inner space and on which the substrate is placed;
    a fixing plate disposed in an exhaust port disposed in a sidewall of the chamber along a circumference of the susceptor, the fixing plate having a plurality of through-holes; and
    at least one sliding plate disposed on an upper or lower portion of the fixing plate to rotate with respect to a center of the susceptor, the at least one sliding plate selectively opening and closing the through-holes and including
        an upper plate disposed on the fixing plate and through which a discharge hole passes, and
        a side plate connected to an outer circumferential surface of the upper plate to move along the sidewall of the chamber, the side plate having a magnetic body;
    a housing spaced apart from an outer wall of the chamber to provide a transfer passage blocked against the outside;
    a blocking plate disposed in the housing to partition the transfer passage into a plurality of transfer sections;
    a magnet disposed in each of the transfer sections to apply a magnetic force to the side plate, thereby moving together with the side plate;
    an elastic member disposed between the blocking plate and the magnet to provide an elastic force toward the magnet; and
    hydraulic lines each of which is disposed in a transfer section to provide a fluid pressure so that the magnet is movable toward the blocking plate.

2. The apparatus of claim 1, further comprising an exhaust plate disposed along a circumference of the susceptor on a discharge hole defined between the susceptor and the exhaust port, the exhaust plate having a plurality of upper and lower exhaust holes defined in an inner surface thereof.

3. The apparatus of claim 2, wherein an upper end of each of the fixing plate and the at least one sliding plate is disposed under the upper exhaust holes.

4. The apparatus of claim 1, wherein the fixing plate has a ring shape, and
    the at least one sliding plate has a plurality of arc shapes that are spaced apart from each other.

5. The apparatus of claim 1, wherein the at least one sliding plate is capable of being switched between an opening position at which the through-hole communicates with the discharge hole to correspond to each other and a blocking position at which the through-hole is closed.

6. The apparatus of claim 1, further comprising:
    a flow rate adjustor disposed in the hydraulic lines to adjust a flow rate of the hydraulic lines; and
    a controller connected to the flow adjustor to control the flow rate adjustor.

7. The apparatus of claim 1, wherein the chamber comprises:
    a main body; and
    a chamber lid disposed on the chamber body to close an upper portion of the chamber body,
    wherein the apparatus for processing the substrate further comprises a supply port disposed in the chamber lid to supply a gas toward the inner space.

* * * * *